United States Patent [19]

Dorenbos

[11] 4,047,624
[45] Sept. 13, 1977

[54] WORKPIECE HANDLING SYSTEM FOR VACUUM PROCESSING

[75] Inventor: Frederick William Dorenbos, El Cerrito, Calif.

[73] Assignee: Airco, Inc., Montvale, N.J.

[21] Appl. No.: 624,498

[22] Filed: Oct. 21, 1975

[51] Int. Cl.² ............................................. C23C 13/08
[52] U.S. Cl. ...................................... 214/17 B; 118/49
[58] Field of Search .......................... 118/49; 266/250; 214/17 B, 18 R, 152; 104/89, 162, 163

[56] References Cited

U.S. PATENT DOCUMENTS

| | | | |
|---|---|---|---|
| 403,687 | 5/1889 | Michales | 104/89 |
| 922,070 | 5/1909 | Wallace et al. | 104/102 X |
| 3,125,232 | 3/1964 | Brinkman et al. | 214/17 B |
| 3,192,645 | 7/1965 | Oetjen et al. | 198/19 X |
| 3,469,560 | 9/1969 | Bukkila et al. | 118/49 X |
| 3,521,765 | 7/1970 | Kauffman et al. | 214/17 B |
| 3,568,632 | 3/1971 | Cawthon | 118/49 |
| 3,604,362 | 9/1971 | Goirand | 104/89 X |
| 3,656,454 | 4/1972 | Schrader | 118/49 |
| 3,848,728 | 11/1974 | Liebrick et al. | 198/203 X |

Primary Examiner—Robert G. Sheridan
Attorney, Agent, or Firm—David A. Draegert; Edmund W. Bopp

[57] ABSTRACT

Apparatus and method are disclosed for transporting discrete workpieces between the outside and inside of a pressure sealable chamber, such as a chamber under vacuum. At least one pressure lock is attached to the chamber and separated therefrom by a gate valve. The lock includes a door with associated means for receiving supporting and transporting a workpiece or a workpiece carrier. Means for conveying the workpiece between the lock and the chamber, as well as means for receiving and supporting the carrier in the chamber are disclosed. The apparatus allows a carrier to be mounted on the open door so that the carrier is automatically transported into the lock as the door is closed. The lock is evacuated while the door and the gate are closed and then the gate is opened to allow the carrier to be conveyed into the chamber.

13 Claims, 6 Drawing Figures

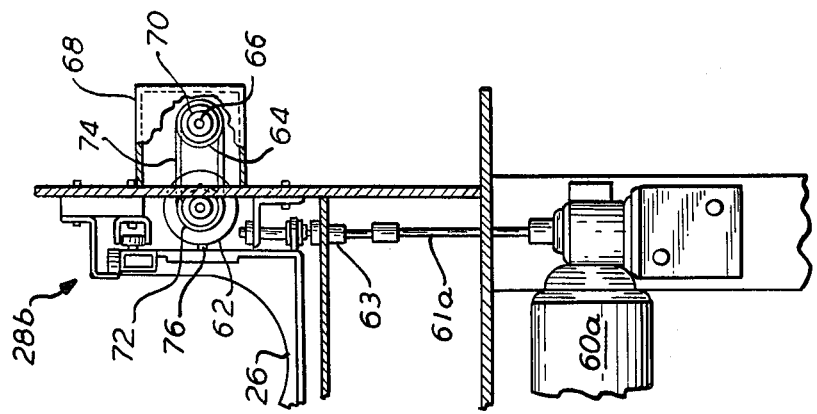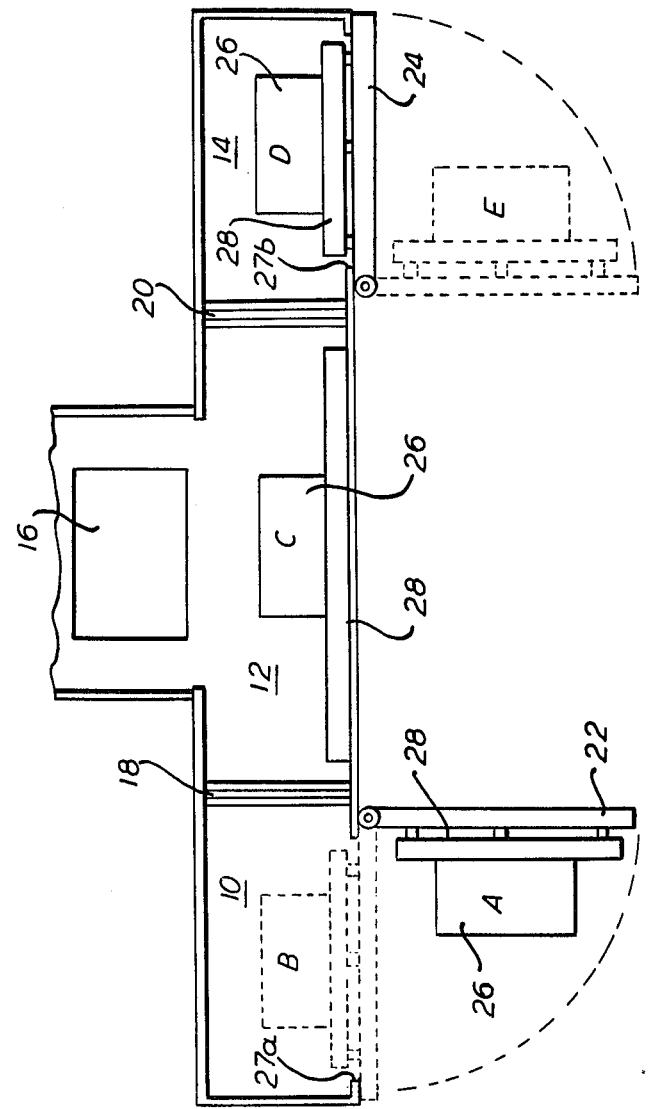

WORKPIECE HANDLING SYSTEM FOR VACUUM PROCESSING

BACKGROUND OF INVENTION

Field of Invention and Description of the Prior Art

This invention is a method and apparatus for automatically feeding discrete substrates into and out of a continuous vacuum chamber. In a preferred embodiment this device is used to feed discrete substrates one at a time into a continuously operating vacuum coating apparatus. The problem is to feed the substrates into the coating apparatus one at a time, without breaking the vacuum, contaminating the environment in the coating apparatus or allowing coating material to escape.

Batch processing has been used in the prior art; however, the obvious disadvantage has been low production and the need for highly trained labor to control the process. Continuous process apparatus has also been developed using baffles or flapper valves to allow workpieces to be fed singly into an open ended machine. The machine is continuously evacuated to maintain vacuum conditions in the interior while outside air constantly enters the machine through the baffles. This type of machine has been referred to as allowing air to enter the interior through "calibrated leaks" which are compensated for by continuous operation of the vacuum pumps.

In the present invention the vacuum chamber or associated coating apparatus may be held at vacuum under steady conditions without leakage or contamination by outside air. Additionally, the method and apparatus of this invention allows fully automatic and rapid feeding of workpieces into the vacuum chamber where the workpieces may be operated on in any manner.

This invention represents a specific improvement over the device patented by Robert L. Shrader in U. S. Pat. No. b 3,656,454 issued Apr. 18, 1972.

SUMMARY OF INVENTION

The apparatus of this invention comprises a sealable chamber and a first lock, and may include a second lock. A gate valve separates each lock from the central sealable chamber. Each lock has a door through which a workpiece or a carrier holding several workpieces may pass. With its gate valve and door closed, each lock is a separate chamber capable of maintaining a high vacuum.

Means for receiving, supporting and conveying the carrier are associated with the door of each lock. Means for receiving, supporting and conveying the carrier are located in the chamber. Sensor means and control means are provided for sensing and controlling the conditions in each of the chambers.

While a vacuum is continuously maintained in the central chamber, a carrier may be mounted on the support means on the door of the first or load lock. When the door is closed, the carrier is transported into the load lock. After the load lock is evacuated, the first or load gate is opened and the carrier is conveyed into the central chamber where the workpieces may be operated on in any manner. When the desired operations are completed the carrier may be removed from the central chamber by transporting it back through the first lock. However, it is preferred to utilize a second or unload lock which operates in similar fashion to the load lock. At an appropriate time, the second or unload gate is opened and the carrier is conveyed into the previously evacuated unload lock. The unload gate is closed and the unload lock is vented to atmosphere. The door of the unload lock may then be opened which moves the carrier out of the unload lock where it may be removed from the supporting means.

In a preferred embodiment this invention is used in association with a continuous process vacuum coating apparatus for transporting workpieces between the outside and the inside of the central chamber. The central chamber functions as a holding chamber for a multiplicity of discrete substrates which are removed from the carrier one at a time and fed into the coating apparatus. The same embodiment may be used to receive and unload the substrates from the coating apparatus at the point of discharge. The invention does not depend upon association with a particular coating apparatus, nor does it depend upon the particular operation performed on the workpieces in the vacuum chamber.

DESCRIPTION OF DRAWINGS

FIG. 1 is a schematic representation of the basic features of this invention as it might be used to feed discrete substrates into a continuously operating vacuum coating apparatus.

FIG. 5 is a sectional view taken along line 5—5 shown in FIG. 2, with the side of the extension box on the chamber partially cut away.

DETAILED DESCRIPTION OF PREFERRED EMBODIMENT

Figure 2:
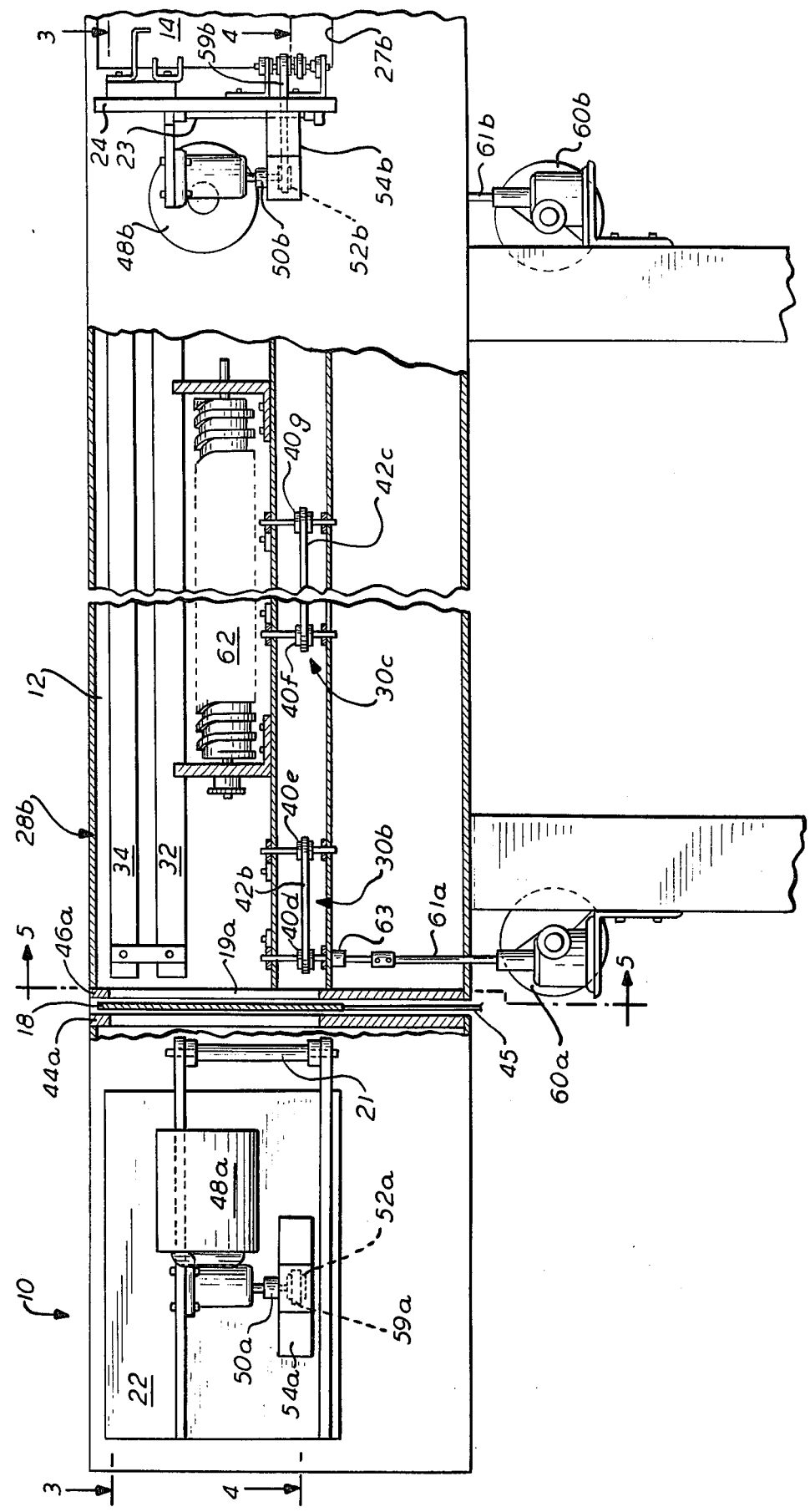
FIG. 2 is a front view of a preferred embodiment of this invention with the load door in a closed position and the unload door in an open position; the front of the vacuum chamber is cut away in part to show the interior elements.
Figure 3:
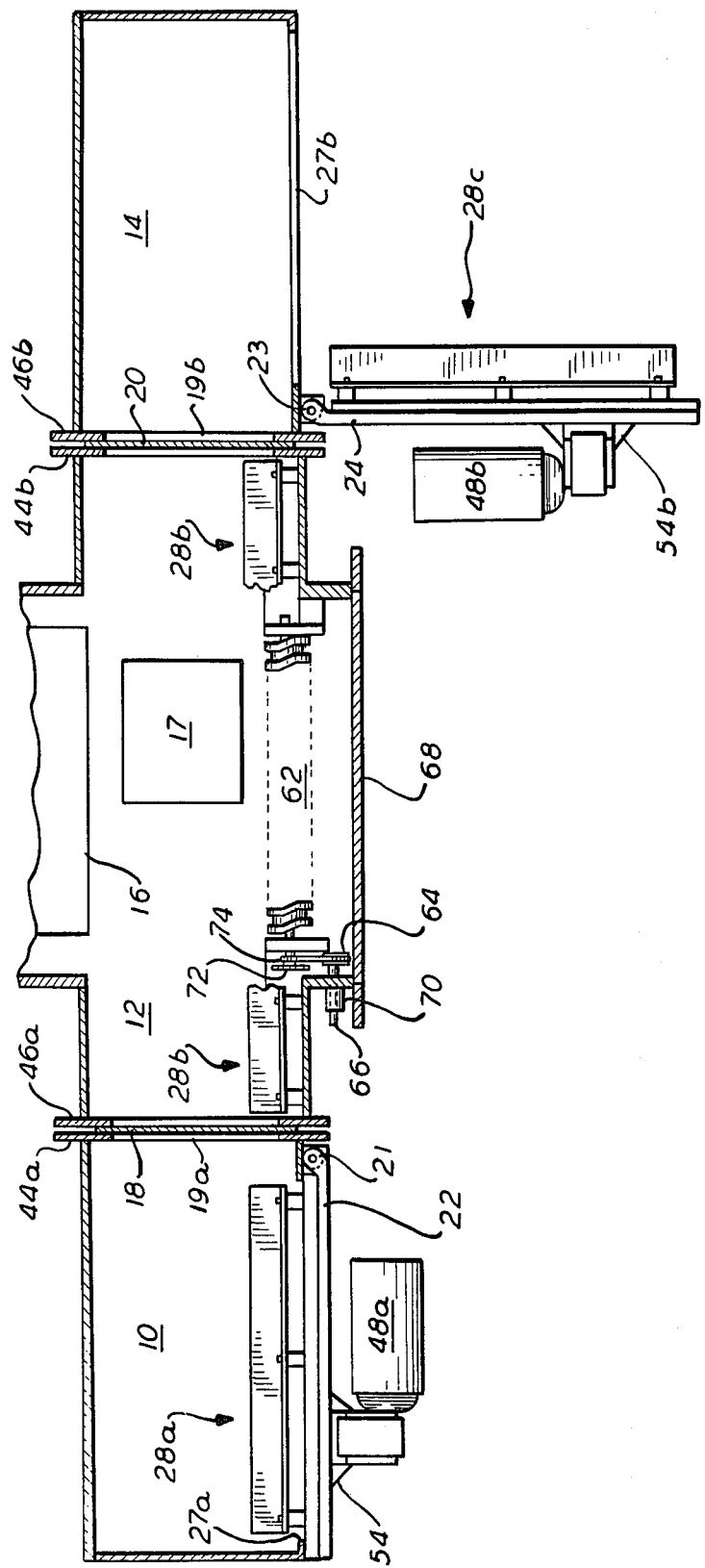
FIG. 3 is a sectional view taken along line 3—3 shown in FIG. 2; part of the track in the vacuum chamber is cut away to show the index cam.
Figure 4:
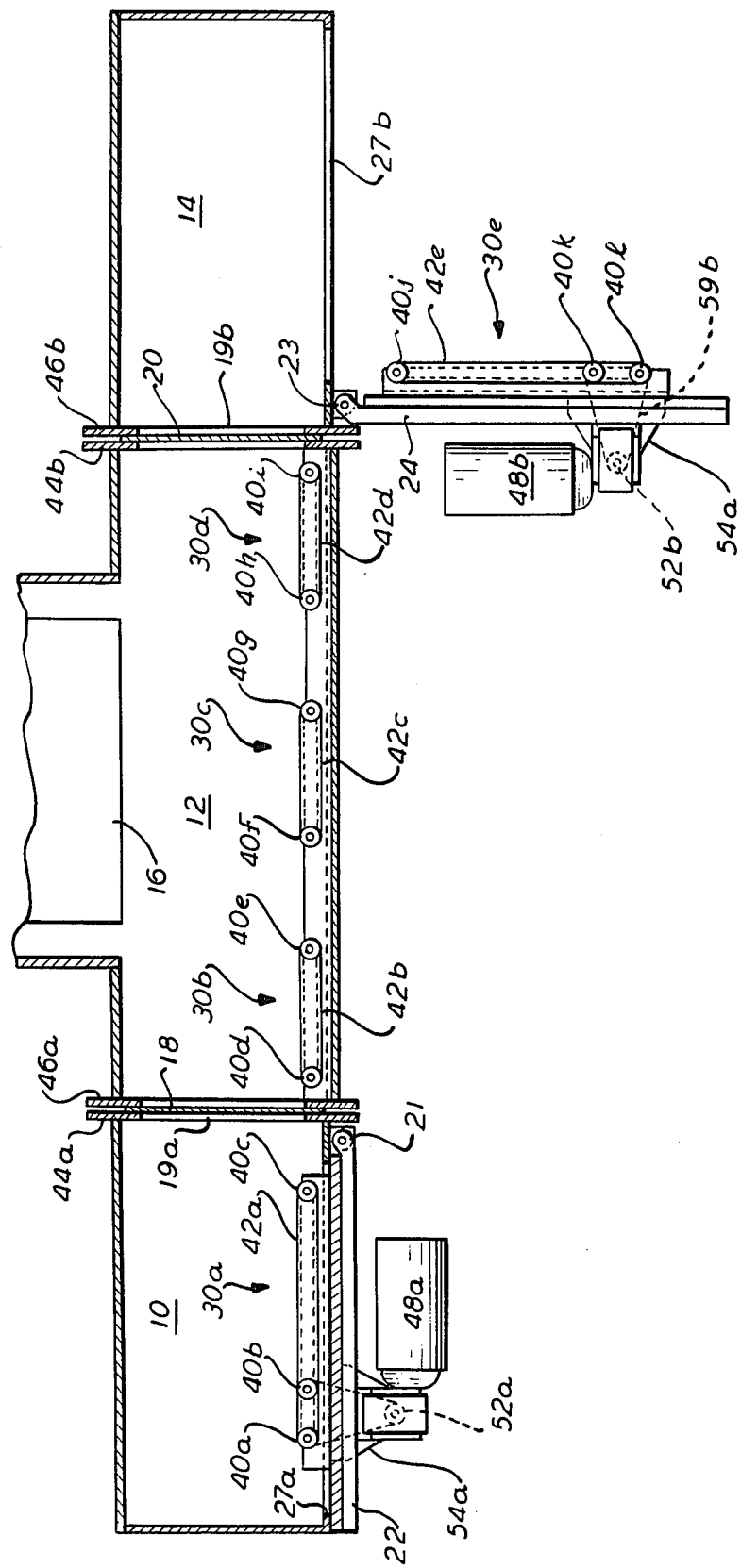
FIG. 4 is a sectional view taken along line 4—4 shown in FIG. 2.

FIG. 1 shows schematically a three chamber system having a first lock 10 which may be a load lock, a pressure sealable chamber 12 and a second lock which may be unload lock 14. Preferably, central chamber 12 is continuously maintained under vacuum, and it may serve as a holding chamber for feeding discrete substrates 15 into a continuous vacuum coating apparatus 16. Additionally, the vacuum chamber 12 is completely isolated from atmospheric pressure for maintenance of vacuum conditions and it is separated from the load lock 10 and unload lock 14 by a first gate (load gate) 18 and a second gate (unload gate) 20. Load gate 18 and unload gate 20 have an open position for placing the vacuum chamber 12 and the respective locks 10 and 14 in direct communication. These gates 18 and 20 also have a closed position at which they pressure seal the gate apertures between the respective locks and the chamber 12 so that vacuum conditions may be maintained.

The load lock 10 and the unload lock 14 advantageously are mirror images of each other to simplify construction and operation. Load lock 10 has a load door 22 and unload lock 14 has a similar aperture of the respective lock. As shown in FIG. 1, the boxes shown in positions A, B, C, D and E represent carriers 26 for the discrete workpieces to be loaded into the coating apparatus 16. Means to mount and to transport the carriers 26, such as a track 28, are associated with the doors 22 and 24, and with a side of the vacuum chamber 12. When a carrier is mounted on the load door 22 in its open position, as at A, the load door 22 may be moved to its closed position to swing the carrier 26 through door aperture 27a into the load lock 10 at position B. After the load lock 10 is evacuated, load gate 18 is opened, the carrier is automatically conveyed into the vacuum chamber 12 and load gate 18 is closed. The commercial embodiment includes a means 17 inside the vacuum chamber 12 for removing individual substrates from the carrier 26. The substrates are then conveyed one at a time through a coating apparatus 16. While this occurs, load lock 10 may be returned to atmospheric pressure and load door 22 opened to receive another carrier 26. After all of the substrates are removed from the carrier 26, unload gate 20 is opened and the carrier is conveyed into unload lock 14 which has been previously evacuated. Unload gate 20 is then closed, the unload lock 14 vented to atmosphere and unload door 24 opened, thus transferring the now empty carrier 26 out of the unload lock 14, where it may be manually or automatically removed from the supporting means. Apparatus similar to 17 may be used to pick up the substrates, one at a time, at the point of discharge of the coating apparatus 16. The substrates would be placed in carriers 26 which entered empty via load lock 10 and which leave full via unload lock 14.

Figure 6:
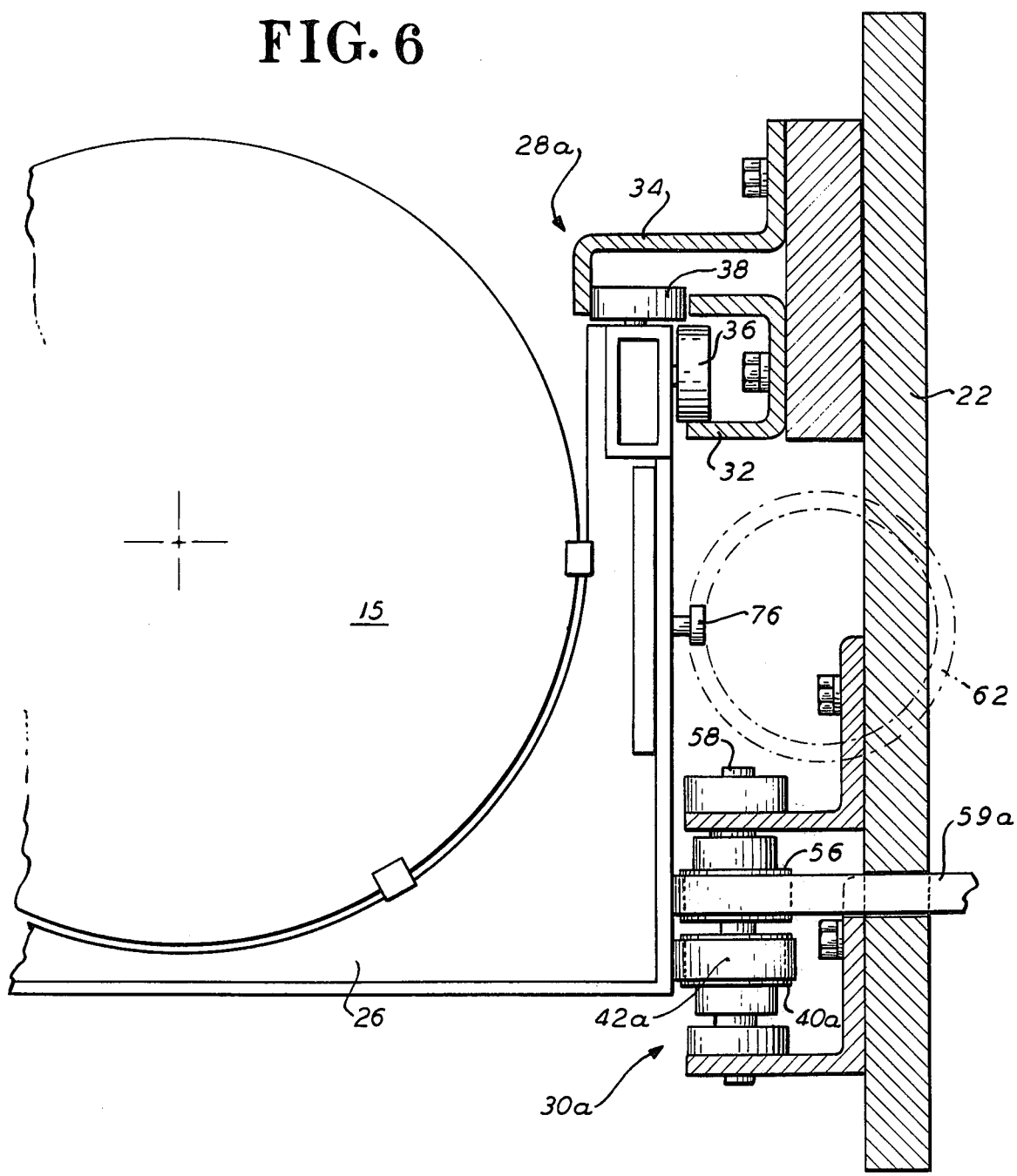
FIG. 6 is a detail view of the track and transporter on the load door, showing a carrier with a workpiece mounted thereon; the index cam is not located on the load door but it is shown in dotted outline to illustrate the engagement of the carrier button with it.

A preferred embodiment of this invention is shown in greater detail in FIGS. 2 through 5. Load lock 10 has a first door or load door 22 on one side, which shall be called the front side, and a first gate or load gate 18 between the load lock 10 and the vacuum chamber 12. With both load door 22 and load gate 18 closed, load lock 10 comprises a pressure sealable chamber of a size and shape to receive an appropriate carrier 26 (FIG. 6). When load gate 18 is open load lock 10 communicates directly with the vacuum chamber 12 through gate aperture 19 so that a carrier 26 may be transported through the aperture of the load gate 18 from one chamber to the other. An unload lock 14 is sustantially a mirror image of load lock 10, also having an unload door 24 and an unload gate 20, which when closed, seals unload lock 14 to comprise another airtight chamber. The vacuum chamber 12 is disposed between the load and unload locks 10 and 14, so that the three chambers lie in line to facilitate conveyance of the carriers 26 from one chamber to another. Load and unload doors 22 and 24 may be mounted in any suitable manner such as on hinges 21 and 23.

Carrier support means, preferably a rack 28a, are attached to the inside of load door 22. Conveying means 30a are also attached to the inside of load door 22. The carrier support means may take any form which allows the carrier 26 to be removable therefrom and easily conveyed between chambers. Typically the rack 28a comprises a U-shaped elongated member 32 suitably attached to the load door 22 with the open portion of the U facing away from the door, the arms thereof being disposed horizontally, as shown in FIG. 6. A second roughly S-shaped elongated member 34 is attached to the door above the U-shaped member 32 so that one arm of the S-shaped member 34 curves down and terminates at a level in line with the upper arm of the U-shaped member 32. Carrier 26 is preferably provided with at least two sets of wheels which engage the track 28a. Each set of wheels comprises a first wheel 36 rotatable about a horizontal axis and which is receivable in the open part of the U-shaped member 32 with the vertical weight of the carrier 26 being born by this wheel 32 on one of the horizontal arms of the U-shaped member 32. A second wheel 38 in each set is rotatable about a vertical axis and bears against the arm of the S-shaped member 34 which curves down in front of the U-shaped member 32. This construction of the track 28a allows a carrier 26 to be mounted either by rolling the carrier 26 horizontally onto the track 28a from one end, or the carrier 26 may be hooked directly onto the track 28a by holding the carrier 26 at an angle away from the load door 22, inserting the two wheels 36 and 38 of each set into engagement with the respective U- or S-shaped member 32 and 34 and releasing the carrier 26 to its normal position suspended by the track assembly 28a.

The conveying means or conveyor, 30a is preferably mounted on the inside face of the load door 22 below the track 28a so that the weight of the carrier 26 suspended from the track 28a will cause the carrier 26 to bear against the conveyor 30a. It should be apparent from the above description of the track 28a, that the carrier 26 is supported in a free swinging manner at a point offset from the carrier's center of gravity. Thus, there is a tendency for the weight of the carrier 26 to swing it toward the load door 22, except that this tendency is resisted by the presence of conveyor 30a. Conveyor 30a preferably comprises a pulley and belt system having at least two pulleys 40a and 40c which are mounted on the load door 22 and spaced apart beneath the enlongated track 28a. The pulleys 40a and 40c are rotatable about a vertical axis and support a belt 42a which is positioned parallel to track 28a. The rear face of the carrier 26 bears directly against the belt 42a and the friction between the carrier 26 and belt 42a affords the driving connection whereby the carrier 26 may be transported or conveyed along track 28a. Means are also provided to drive the belt 42a which will be described more fully below.

In operation a carrier 26 may be manually or automatically mounted onto the track 28a on the open load door 22. When the load door 22 is closed, the carrier is moved with the door into the chamber of load lock 10. Load lock 10 may then be evacuated to the proper level of vacuum in preparation for conveying the carrier 26 into the vacuum chamber 12.

A load gate 18 is located between the load lock 10 and vacuum chamber 12 which is slidable between two plates 44 and 46 in sealing relation thereto. This load gate may be similar to the "valve plates" or "vacuum valves" described in U.S. Pat. No. 3,656,454 issued Apr. 18, 1972 to Robert L. Shrader. The load gate 18 is controlled by a suitable actuator 45 so that it may be opened and shut to allow a carrier 26 to pass therethrough and to maintain the appropriate pressure conditions in each of the chambers.

A second section of track 28b is mounted in the vacuum chamber 12 so that when the load door 22 is closed the first section of track 28a is in alignment therewith. Similarly, a third section of track 28c is mounted on the unload door 24 so that all three sections lie in line when the doors are closed. Sufficient clearance exists between the sections of track 28 so that the appropriate load gate 18 or unload gate 20 may open and close, while a carrier may still roll from one section of track 28 to another. Although it was previously stated that each carrier preferably has at least two sets of wheels, three or more sets are preferred to provide adequate support if there are any gaps between sections of track 28 as described. Thus, when one set of wheels is unsupported between sections of track 28, the remaining sets of wheels will continue to support the carrier 26.

In the preferred embodiment there are five separate conveyors 30 of similar construction except that the length, drive means and mounting details differ to some extent. The conveyor 30a, mounted on the load door 22 has already been described. It is preferably driven by a motor 48a mounted on the outside of load door 22. Since it is desirable for the motor 48a to operate in atmospheric pressure, the motor shaft passes through a vacuum feed-through 50 and drives a drive pulley 52 inside an extension box 54 on the load door 22. Drive pulley 52 drives at least one driven pulley 56 (FIG. 6) which is keyed to the same shaft 58 as conveyor pulley 40a. Preferably there are two driven pulleys 56 driven by the same belt 59 and two conveyor pulleys 40a and 40b keyed to them. This provides easier installation of the conveyor belt 42. When the load lock 10 is under vacuum conditions, the extension box 54 is also evacuated so all belts and pulleys operate in vacuum. The third conveyor pulley 40c near the hinge of load door acts as an idler for conveyor belt 42a.

As previously stated, the unload lock 14 is preferably a mirror image of the load lock 10. This is also true for the track 28, conveyor 30, drive means and all other associated parts as may be readily seen in the drawings. Although the details of the unload lock 14 are not described, it will be noted that like elements are labelled with like numbers in the drawings so that the structure of the unload lock 14 may be studied by referring to the previous description of the load lock 10. In some cases, like elements which appear in several places in this invention are additionally identified by small letter suffices (e.g., pulley 40d) to aid understanding.

The remaining conveyors 30b, 30c and 30d are located in the vacuum chamber 12 in line with the conveyor on the load door 22. One of the conveyors is positioned near the load gate 18 to pick up and drive a carrier 26 as it is fed from the load lock 10. This conveyor 30b is preferably driven by a separate motor 60a which is connected to one of the conveyor pulleys 40d by a shaft 61a and a vacuum feed-through 63. Another conveyor pulley 40e acts as an idler. A second conveyor 30d in the vacuum chamber 12 is located near the unload gate 20 and is preferably a mirrow image of the conveyor 30b. This conveyor serves to feed an empty 26 out of the vacuum chamber 12 to the unload lock 14. A third conveyor 30c is located in the center of the vacuum chamber 12, and is not driven directly at all, but merely acts as an idler to support a carrier 26 which is separately controlled at this area. This idler conveyor 30c is similar to the others in basic structure except that it has two idler pulleys 40f and 40g, and no drive means. A belt 42c is shown at this location in the fingers, but any idler means may be used, such as two plain wheels in place of pulleys 40f and 40g.

This invention does not depend upon the operation performed on the discrete workpieces in the vacuum chamber 12; however, in the preferred embodiment, discrete substrates are removed one at a time from a carrier 26 in the vacuum chamber 12 and transported into and through a separate coating apparatus 16. For this purpose, an indexing means, such as a cam 62, is located in the vacuum chamber 12, parallel to and between the track 28b and the idler conveyor 30c. Indexing cam 62 is driven by a separate motor (not shown) which turns a drive pulley 64 on shaft 66. Shaft 66 extends out from an extension box 68 through a vacuum feedthrough 70 so that the motor may operate in atmospheric conditions. Drive pulley is conneted to an index cam pulley 72 by a belt 74, which is preferably a toothed or timing belt. The indexing cam 62 controls the movement of the carrier 26 by engagement with a cam follower or button 76 on the back of the carrier 26. The track 28 and idler conveyor 30c support the weight of the carrier 26 and the substrates 15 so that indexing cam 62 is able to easily advance the carrier 26. The indexing cam 62 is constructed to advance the carrier 26 so that each substrate 15 is presented at a predetermined point, and to pause momentarily before advancing the carrier 26 so that next substrate 15 is presented at that point. Conventional pick up means, shown at 17 in the drawings, may then engage the substrate 15 so presented, and remove it from the carrier 26 for any further desired operation. The indexing cam 62 continues to advance the carrier 26 as described until all substrates 15 are removed, when the conveyor 30d near the unload gate 20 will feed the carrier 26 out to the unload lock 14. Preferably, a multiple of carriers 26 are employed in this system so that when the last substrate 15 is removed from one carrier 26, the first substrate 15 in the next carrier is immediately presented at the pick up point which the next indexing movement caused by the indexing cam 62. At the same time the remaining components of the system cooperate to feed carriers 26 to and from the indexing cam 62 while continuously maintaining vacuum conditions in vacuum chamber 12. Control means and appropriate sensors are also provided to sense the conditions of each chamber and control the sequencing of the components.

The operation of this invention is most easily described with respect to each chamber. To begin, the load lock 10 is at atmospheric pressure, the load gate 18 is closed, the load door 22 is open and the conveyor 30a is still. A carrier 26 has been previously loaded with a multiple of substrates 15 and the carrier 26 is either manually or automatically loaded onto the track 28a on load door 22. Load door 22 is closed, and when this is sensed by the control means, load lock 10 is evacuated. When the proper vacuum is reached, load gate 18 opens and conveyor 30a is activated to quickly feed the carrier 26 into the vacuum chamber 12. When the carrier 26 has cleared the load gate 18, the gate is closed, the conveyor 30a is stopped, the load lock 10 is brought up to atmospheric pressure and the load door 22 is opened, ready to receive another loaded carrier 26.

When a carrier 26 is fed into the vacuum chamber 12, the first conveyor 30b advances the carrier quickly until it buts against the next carrier 26 which is still engaged with the index cam 62. The conveyor 30b continues to urge the carrier 26 forward until the button 76 engages with the indexing cam 62. During this period the conveyor belt 42b may slip against the back of the carrier 26, or separate clutch means, or speed control means (not shown) may be provided in the drive mechanism. When the indexing cam 62 engages the button 76, the carrier 26 is indexed and the substrates 15 removed as previously described. As the carrier 26 is indexed, the conveyor 30d near the unload gate 20 will engage the carrier 26 and urge it toward the unload lock 14. As with the carriers fed into the cam 62, the conveyor belt 42d may slip until the button 76 disengages from the cam 62. As before, other clutch or speed control means may be provided. Before the carrier 26 advances to the unload gate 20, the unload lock 14 will have been evacuated and the unload gate will open. The conveyor 30d will then feed the empty carrier quickly out of the vacuum chamber 12 and the unload gate 20 will close.

The unload lock 14 operates in a sequence similar to the load lock 10. When a carrier 26 is fed from the vacuum chamber 12 and the unload gate 20 is closed, the unload lock 14 is brought to atmospheric pressure. The unload door 24 opens, thus swinging the empty carrier 26 out to a position where it may be manually or automatically removed for reloading with substrates 15. The unload door 24 is then closed and the unload lock 14 evacuated so it is ready to receive the next carrier 26 from the vacuum chamber 12.

The structure of this invention has been described from the point of view of loading or feeding discrete workpieces into a continuously operating coating apparatus. The same mechanism may also be used to unload or receive finished workpieces at the end of the coating process. The structure and operation of the invention are the same in that case except empty carriers 26 are placed on the door 22 of the load lock 10, workpieces are placed in, rather than removed from, the carrier 26 in the vacuum chamber 12, and full carriers 26 are removed from the unload lock 14.

Additionally, this apparatus may be used to feed workpieces to be operated on directly in the vacuum chamber 12 and the finished workpieces conveyed out to the unload lock 14. That is, at least one workpiece may be conveyed into the vacuum chamber 12 where any operation may be performed on it, and then the finished product may be conveyed out through the unload lock 14. It should be noted, however, that the basic operation of feeding discrete workpieces to and from a continuous vacuum process or chamber still occurs.

In other embodiments or uses, this invention may be employed in any system where it is desired to operate chamber 12 at pressures other than atmospheric (i.e. above or below atmospheric) and it is also conceived that workpieces or carriers 26 may be loaded and unloaded from chamber 12 through the same lock serving the dual purpose of a load lock and an unload lock.

It should be apparent that numerous other embodiments and variations may be conceived from the teaching of this invention and, therefore, the descriptions herein should not be interpreted as limiting the scope of the invention as claimed.

What is claimed is:

1. Apparatus for transporting at least one workpiece between the outside and the inside of a pressure sealable chamber, comprising:
    a. a pressure sealable lock connected to the chamber having a gate aperture through which the workpiece is transportable between the inside of the chamber and the lock, and having a door aperture through which the workpiece is transportable between the lock and the outside of the chamber;
    b. a door movable between an open position and a closed position for sealing the door aperture;
    c. means associated with the door for receiving, supporting and transporting the workpiece through the door aperture as the door is moved between its open and closed positions;
    d. a gate movable between an open position and a closed position for sealing the gate aperture;
    e. means mounted on the door for driving the workpiece and for conveying the workpiece through the gate aperture when the gate is in its open position;
    f. means for receiving and supporting the workpiece inside the chamber; and
    g. a pivot for supporting the door.

2. Apparatus for transporting a discrete workpiece between the outside and the inside of a pressure sealable chamber, comprising:
    a. a carrier for transporting at least one workpiece;
    b. a first lock connected to the chamber;
    c. a first door associated with the first lock and movable between an open position and a closed position in which the first lock can be pressure sealed;
    d. means mounted on the first door for receiving, supporting and transporting the carrier between the outside of the chamber and the first lock when the first door is moved between its open position and its closed position;
    e. first conveyor means mounted on the first door for driving the carrier and for conveying the carrier between the first lock and the chamber;
    f. a first gate located between the first lock and the chamber and movable between an open position in which the carrier can be conveyed between the lock and the inside of the chamber, and a closed position in which the chamber can be sealed;
    g. means for receiving and supporting the carrier inside the chamber; and
    h. a first hinge for supporting the first door.

3. Apparatus according to claim 2 wherein the first door receiving, supporting and transporting means comprises a track attached to the first door; and wherein the carrier comprises a wheel rollably engagable with the track.

4. Apparatus according to claim 3 wherein the first conveyor means comprises:
    a first belt associated with the first door for engaging the carrier;
    at least two pulleys around which the first belt is movable; and
    means for driving the first belt and thereby conveying the carrier.

5. Apparatus according to claim 4 further comprising:
    a second belt inside the chamber for engaging the carrier;
    at least two pulleys around which the second belt is movable; and
    means for driving the second belt and thereby conveying the carrier.

6. Apparatus according to claim 2 further comprising:
    i. a second lock connected to the chamber;
    j. second conveyor means mounted on the second door for driving the carrier and for conveying the carrier between the chamber and the second lock;
    k. a second gate located between the second lock and the chamber and movable between an open position in which the carrier can be conveyed between the second lock and the inside of the chamber, and a closed position in which the chamber can be sealed;
    l. a second door associated with the second lock and movable between an open position and a closed position in which the second lock can be pressure sealed;
    m. means mounted on the second door for receiving, supporting and transporting the carrier between the second lock and the outside of the chamber when the first door is moved between its closed position and its open position; and n. a second hinge for supporting the second door.

7. Apparatus according to claim 6 further comprising means for removing the workpiece from the carrier while the carrier is inside the chamber.

8. Apparatus according to claim 6 further comprising means for placing at least one workpiece in the carrier while the carrier is inside the chamber.

9. Apparatus according to claim 6 wherein the first conveyor means comprises:

a first belt for engaging the carrier;

at least two pulleys around which the first belt is movable; and means for driving the first belt and thereby conveying the carrier.

10. Apparatus according to claim 9 wherein the second conveyor means comprises:

a second belt for engaging the carrier;

at least two pulleys around which the second belt is movable; and means for driving the second belt and thereby conveying the carrier.

11. Apparatus according to claim 10 further comprising:

a third belt inside the chamber for engaging the carrier;

at least two pulleys around which the third belt is movable; and means for driving the third belt and thereby conveying the carrier.

12. Apparatus according to claim 11 further comprising:

a fourth belt inside the chamber for engaging the carrier; and at least two pulleys around around which the fourth belt is movable.

13. Apparatus for feeding discrete workpieces to and from a vacuum chamber continuously maintained under vacuum conditions comprising:

a. a load lock attached to the vacuum chamber and separated therefrom by a load gate movable between a closed sealed position and an open position where the load lock and the vacuum chamber are in direct communication, said load lock presenting a chamber which will receive at least one workpiece:

b. an unload lock attached to the vacuum chamber and separated therefrom by an unload gate movable between a closed sealed position and an open position where the load lock and the vacuum chamber are in direct communication, said unload lock presenting a chamber which will receive at least one workpiece:

c. a load door on the load lock which when closed, pressure seals the chamber in the load lock;

d. an unload door on the unload lock which when closed, pressure seals the chamber in the unload lock;

e. means for supporting at least one workpiece associated with the load door, so that when said load door is open, said supporting means will receive and support at least one workpiece outside of the load lock, and as said load door is moved to closed position, the workpiece will be transferred into the load lock;

f. first conveyor means mounted on the load door for conveying the workpiece from the load lock to the vacuum chamber when the load door is closed and the load gate is open;

g. means inside the vacuum chamber for receiving and supporting the workpiece when it is conveyed from the load lock;

h. second conveyor means mounted on the unload door for conveying the workpiece from the vacuum chamber to the unload lock when the unload gate is open, and the unload door is closed;

i. means for supporting at least one workpiece associated with the unload door, so that when said unload door is closed, the workpiece will be received and supported in the unload lock when it is conveyed from the vacuum chamber, and as the unload door is moved to an open position, the workpiece will be transferred out of the unload lock;

j. means for controlling the pressure independently in each of the load lock, vacuum chamber and unload lock, so that a vacuum may be maintained continuously in the vacuum chamber, while a workpiece is conveyed into or out of said chamber;

k. a first hinge for supporting the load door; and l. a second hinge for supporting the unload door.

* * * * *